(12) United States Patent
Graceffo et al.

(10) Patent No.: US 11,743,083 B2
(45) Date of Patent: Aug. 29, 2023

(54) METHODS AND APPARATUS FOR PHASE CHANGE DETECTION USING A RESONATOR

(71) Applicant: RAYTHEON COMPANY, Waltham, MA (US)

(72) Inventors: Gary M. Graceffo, Burke, VA (US); Andrew Kowalevicz, Arlington, VA (US); Benjamin P. Dolgin, Alexandria, VA (US)

(73) Assignee: RAYTHEON COMPANY, Waltham, MA (US)

( * ) Notice: Subject to any disclaimer, the term of this patent is extended or adjusted under 35 U.S.C. 154(b) by 331 days.

(21) Appl. No.: 16/929,916

(22) Filed: Jul. 15, 2020

(65) Prior Publication Data

US 2021/0021449 A1  Jan. 21, 2021

Related U.S. Application Data

(60) Provisional application No. 62/874,149, filed on Jul. 15, 2019.

(51) Int. Cl.
| | |
|---|---|
| H04L 27/22 | (2006.01) |
| H03H 7/00 | (2006.01) |
| H01P 7/06 | (2006.01) |
| H03D 3/00 | (2006.01) |
| H03D 3/26 | (2006.01) |
| H04L 27/233 | (2006.01) |

(52) U.S. Cl.
CPC .............. *H04L 27/22* (2013.01); *H01P 7/06* (2013.01); *H03D 3/00* (2013.01); *H03D 3/006* (2013.01); *H03D 3/26* (2013.01); *H03H 7/00* (2013.01); *H04L 27/2334* (2013.01)

(58) Field of Classification Search
CPC . H01P 7/06; H03D 3/00; H03D 3/006; H03D 3/26; H03D 3/30; H03D 3/34; H03D 9/02; H03D 9/00; H03D 9/04; H04L 27/22; H04L 27/233; H04L 27/2334
See application file for complete search history.

(56) References Cited

U.S. PATENT DOCUMENTS

| 2,476,311 | A | * | 7/1949 | Learned | ................... | H03D 9/04 |
| | | | | | | 331/12 |
| 2,638,539 | A | * | 5/1953 | Cuccia | .................... | H01J 31/04 |
| | | | | | | 331/86 |

(Continued)

FOREIGN PATENT DOCUMENTS

GB  2029660 A  *  3/1980  ............... H03D 3/00

*Primary Examiner* — Ryan Johnson
(74) *Attorney, Agent, or Firm* — Lando & Anastasi, LLP

(57) ABSTRACT

Disclosed is a microwave cavity resonator used as a phase change (phase modulation) to intensity change (intensity or amplitude modulation) converter. Certain aspects and embodiments include resonant circuits, such as a resistor, inductor and capacitor (RLC) circuit. Certain aspects and embodiments convert changes in phase to changes in output voltage to perform analog demodulation of a phase modulated microwave carrier. Certain aspects and embodiments use resonance when the reactive components of the circuit (capacitive and inductive components) are equal in magnitude and 180 degrees out of phase with one another, thereby cancelling out the reactance component of the circuit's impedance.

9 Claims, 5 Drawing Sheets

(56) References Cited

U.S. PATENT DOCUMENTS

| | | | |
|---|---|---|---|
| 2006/0226897 A1* | 10/2006 | De Ruijter | H03D 3/26 |
| | | | 329/315 |
| 2018/0054259 A1 | 2/2018 | Kowalevicz et al. | |
| 2018/0091227 A1 | 3/2018 | Dolgin et al. | |
| 2018/0091228 A1 | 3/2018 | Kowalevicz et al. | |
| 2018/0091230 A1 | 3/2018 | Dolgin et al. | |
| 2018/0091232 A1 | 3/2018 | Dolgin et al. | |
| 2018/0102853 A1 | 4/2018 | Dolgin et al. | |
| 2018/0145764 A1 | 5/2018 | Dolgin et al. | |
| 2018/0145765 A1 | 5/2018 | Kowalevicz et al. | |
| 2018/0167145 A1 | 6/2018 | Dolgin et al. | |
| 2018/0234231 A1 | 8/2018 | Dolgin et al. | |
| 2018/0367223 A1 | 12/2018 | Graceffo et al. | |
| 2019/0007091 A1 | 1/2019 | Graceffo et al. | |
| 2019/0158208 A1 | 5/2019 | Dolgin et al. | |

\* cited by examiner

METHODS AND APPARATUS FOR PHASE CHANGE DETECTION USING A RESONATOR

CROSS-REFERENCE TO RELATED APPLICATION

This application claims priority under 35 U.S.C. § 119(e) to U.S. Provisional Application Ser. No. 62/874,149, titled "METHODS AND APPARATUS FOR PHASE CHANGE DETECTION USING A RESONATOR," filed on Jul. 15, 2019, which is hereby incorporated by reference in its entirety.

BACKGROUND

Phase modulation is commonly used to convey information on carrier signals that may be optical or radio frequency (RF)/microwave signals. Conventionally, demodulation of the phase modulated microwave or RF signals is done digitally in the receiver.

SUMMARY OF INVENTION

Aspects and embodiments are directed to using a microwave cavity resonator as a phase change (phase modulation) to intensity change (intensity or amplitude modulation) converter. Certain aspects and embodiments resonant circuits, such as a resistor, inductor and capacitor (RLC) circuit as a microwave cavity resonators. Certain aspects and embodiments convert changes in phase to changes in output voltage to perform analog demodulation of a phase modulated microwave carrier. Certain aspects and embodiments use resonance when the reactive components of the circuit (capacitive and inductive components) are equal in magnitude and 180 degrees out of phase with one another, thereby cancelling out the reactance component of the circuit's impedance.

According to one embodiment, a communications receiver comprises an input to receive a phase modulated radio frequency (RF) input signal, a resonator coupled to the input and configured to receive the phase modulated RF input signal and to produce an electrical output signal having characteristics representative of a phase modulation of the phase modulated RF input signal; and signal processing circuitry configured to receive and process the electrical output signal to produce a decoded information signal.

In one example, the electrical output signal has amplitude variations that correspond to the phase modulation of the phase modulated RF input signal.

In one example, the electrical output signal is a voltage and the amplitude variations are voltage spikes.

In one example, the resonator is fiber-coupled to the input.

In one example, the input is an antenna.

In one example, the resonator is a microwave cavity resonator.

In one example, the resonator includes a resistor, inductor and capacitor (RLC) circuit.

In one example, the RLC circuit includes a series arm having an inductive component connected in series with a capacitive component and a resistive component.

According to one embodiment, a communications receiver comprises an input to receive a phase modulated radio frequency (RF) input signal encoded with information, at least one microwave cavity resonator coupled to the input and configured to receive the phase modulated RF input signal, to internally resonate signal energy in response to receiving the phase modulated RF input signal, and to produce an electrical output signal having a steady-state amplitude and amplitude variations, corresponding to deviations from the steady-state amplitude, that are representative phase transitions in the phase modulated RF input signal, and signal processing circuitry configured to receive and process the electrical output signal to produce a decoded information signal.

In one example, the at least one microwave cavity resonator includes a substantially closed structure defining an internal cavity in which the signal energy is resonated.

In one example, the substantially closed structure is made from metal.

In one example, the internal cavity is hollow.

In one example, the internal cavity is filled with a dielectric material.

In one example, the substantially closed structure is made from a high-permittivity dielectric material.

In one example, the electrical output signal is a voltage and the amplitude variations are voltage spikes.

In one example, the at least one microwave cavity resonator is fiber-coupled to the input.

In one example, wherein the input is an antenna.

According to one embodiment, a communications receiver comprises an input to receive a phase modulated radio frequency (RF) input signal encoded with information, a resistor, inductor, and capacitor (RLC) resonant circuit coupled to the input and configured to receive the phase modulated RF input signal, the RLC circuit including a series combination of an inductive component, a capacitive component, and a resistive component, wherein a voltage sum of a first voltage across the inductive component and a second voltage across the capacitive is representative of a phase modulation of the phase modulated RF input signal, and signal processing circuitry coupled to the RLC circuit and configured monitor the voltage sum to produce a decoded information signal.

In one example, the voltage sum includes voltage spikes corresponding to phase transitions in the phase modulated RF input signal.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

It has been demonstrated that an optical cavity resonator, such as an etalon, can be used as a phase change (phase modulation) to intensity change (intensity or amplitude modulation) converter. Aspects and embodiments disclosed herein extend this concept to microwave cavity resonators and resonant circuits, such as a resistor, inductor and capacitor (RLC) circuit. Microwave cavity resonators work similarly to an optical resonant cavity; however, a difference is that microwave cavity resonators convert changes in phase to changes in output voltage. This phenomenon can be used to perform analog demodulation of a phase modulated microwave carrier, as discussed further below. Like the etalon and microwave cavity resonator, an RLC circuit is also a resonator; however, there is an important distinction. Optical and microwave cavity resonators operate on the scale of a wavelength. For one of these resonators to be resonant, its cavity dimensions must be integer multiples of half wavelengths of the input signal. In contrast, RLC circuits are lumped systems, not distributed. RLC circuits operate on a scale of a carrier cycle. Resonance occurs when the reactive components of the circuit (capacitive and inductive components) are equal in magnitude and 180 degrees out of phase with one another, thereby cancelling out the reactance component of the circuit's impedance. Aspects and embodiments disclosed herein describe a method of phase change detection using these properties of an RLC circuit.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1:
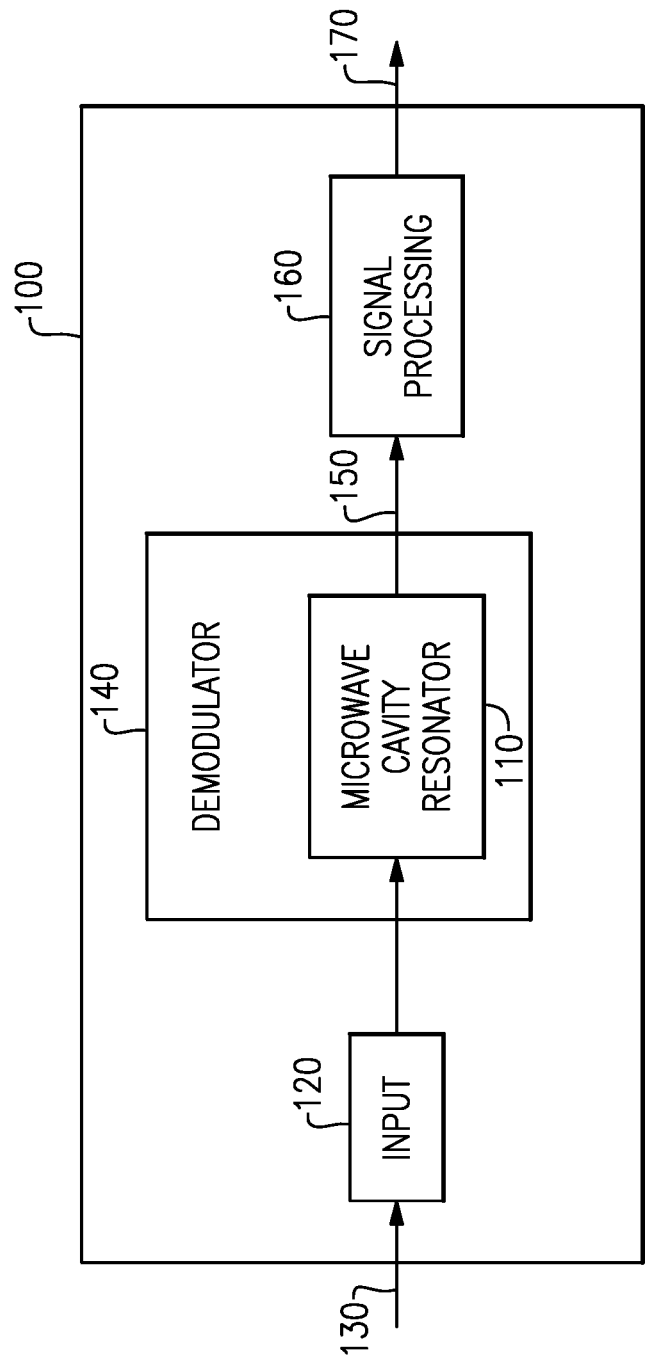
FIG. 1 is a block diagram of one example of an RF communications receiver according to aspects of the present invention.

Referring to FIG. 1, there is illustrated a block diagram of an example of a receiver 100 including one or more microwave cavity resonators 110 that can be used as a phase change detector. The receiver 100 includes an input 120 that receives an incoming (input) phase modulated signal 130.

The input 120 may be any type of signal receiving or coupling mechanism, such as, but not limited to, an antenna (for free space communications applications, for example), a connector, or other signal coupling device that receives the input signal 130 and allows the input signal 130 to be conveyed to other components of the receiver 100. In certain example, the microwave cavity resonator 110 is part of a demodulator 140 that receives the phase modulated input signal 130 and produces an output signal 150. The output signal 150 may have characteristics representative or indicative of the phase modulation of the input signal 130, as discussed further below. The output signal 150 may be processed by signal processing circuitry 160 to produce a decoded information signal 170. The decoded information signal 170 may include the information that was encoded on the phase modulated input signal 130 by the phase modulation of the input signal 130. The signal processing circuitry 160 may include various components, as will be understood by those skilled in the art, such as analog-to-digital converters, filters, amplifiers, controllers, etc., to condition and process the electrical signals 150 received from the demodulator 140 to produce the decoded information signal 170.

Operation of the microwave cavity resonator 110 may be similar to operation of an optical cavity resonator, such as a Fabry-Perot etalon, for example, with a few minor differences. A microwave cavity (also termed a radio frequency (RF) cavity) is a type of resonator that includes a closed (or largely closed) structure that confines electromagnetic fields in the microwave region of the spectrum. The structure may be hollow or filled with a dielectric material. The resonant cavity structure may be made from metal, for example, closed or short-circuited sections of waveguide, or from a high-permittivity dielectric material. Electromagnetic waves that enter the microwave cavity resonator 110 bounce back and forth inside the cavity structure and at the resonant frequencies of the cavity, reinforce one another to form a standing wave inside the cavity (resonant condition). Every microwave cavity resonator has numerous resonant frequencies that correspond to electromagnetic field modes satisfying necessary boundary conditions on the walls of the cavity. Electric and magnetic energy is stored in the cavity and the only losses are due to finite conductivity of cavity walls and dielectric losses of material filling the cavity. As a result, the microwave cavity resonator 110 may operate with extremely low loss at its frequency of operation, providing a high quality factor, which may be beneficial in certain applications.

The input signal 130, in the form of an electromagnetic (EM) wave, enters the microwave cavity resonator 110 with a particular phase. The EM wave resonates in the cavity, building up energy and then exits the cavity as the output signal 150. When a phase change occurs in the input signal 130, there is a momentary discontinuity in the EM field, which causes disruption in the amplitude of the output signal 150, such as a spike in the amplitude, for example. Accordingly, by monitoring the amplitude of the output signal 150, phase transitions in, corresponding to the phase modulation of, the input signal 130 can be detected. In this manner, the phase modulated input signal 130 can be decoded, or demodulated, in the analog domain.

Figure 2:
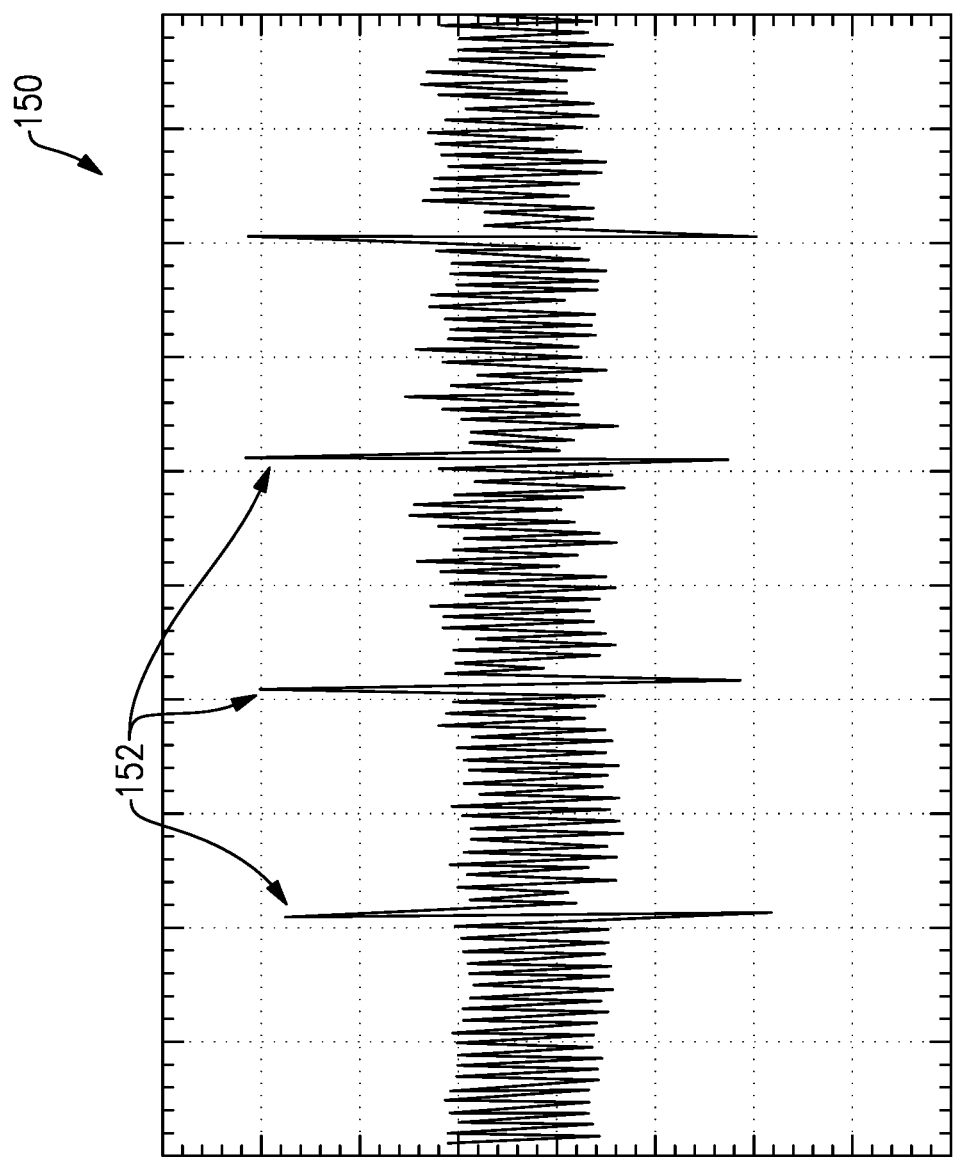
FIG. 2 is a graph illustrating simulated operation of a microwave cavity resonator as may be included in the RF communications receiver of FIG. 1.

FIG. 2 illustrates a simulation of an example of the output signal 150. To verify the expected performance of the microwave cavity resonator 110, a circuit was constructed to emulate the salient aspects of the microwave cavity resonator 110. The results for a binary shift keyed phase modulated input waveform 130 passing through the resonator circuit simulator are shown in FIG. 2. The spikes 152 in amplitude in the simulated output signal 150 correspond to phase changes in the input signal 130. These spikes 152 can be easily detected using a variety of electronic components, such as, but not limited to, a comparator, an envelope detector, or other device, to decode the corresponding phase modulation of the input signal 130.

Thus, according to certain aspects and embodiments, a microwave cavity resonator 110 can be used as a phase change detector, and provides the capability to demodulate phase modulated signals. Use of the microwave cavity resonator 110 in the receiver 100 may provide an entirely analog method of phase change detection, and therefore analog demodulation or decoding of a phase modulated input signal 130. Demodulation can be performed at the carrier frequency, and therefore no frequency down-conversion may be required prior to demodulation. A single microwave cavity resonator 110 may be configured to detect phase changes for a wide range of data rates, providing a highly flexible and robust method of demodulation of phase modulated signals. Further, the receiver 100 may include multiple microwave cavity resonators 110 for demodulation of multiple input signals 130 simultaneously, and/or to accommodate different carrier frequency ranges (as the resonance of the microwave cavity resonator is dependent on frequency), data rates, or other parameters of the input signal 130. Further, although discussed above with reference to microwave signals, and a microwave cavity resonator, various embodiments are not limited to microwave signals, and cavity resonators can be employed as phase change detectors for signals having higher or lower carrier frequencies than the microwave spectral band.

According to certain embodiments, this technique can also be implemented using discrete components, such as inductors and capacitors, rather than a cavity resonator structure. As discussed above, an RLC resonant circuit may operate in a manner similar to a cavity resonator, and can be used to detect phase transitions in a phase modulated input signal.

Figure 3:
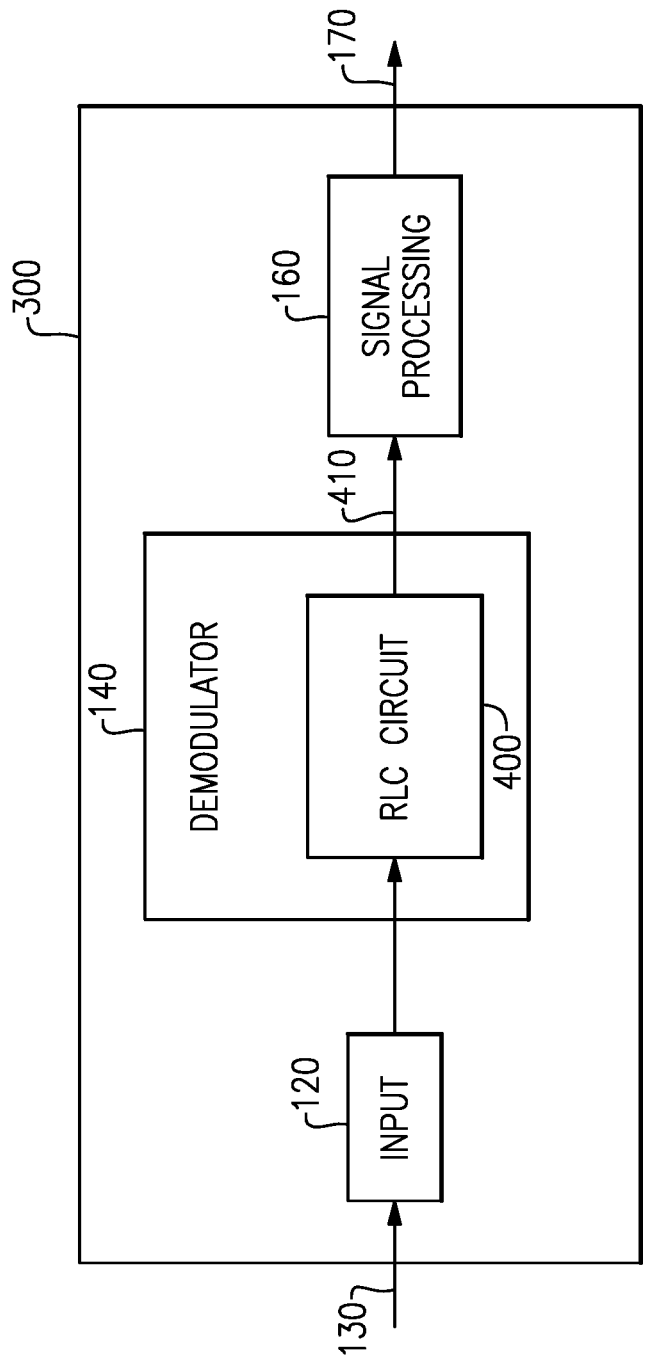
FIG. 3 is a block diagram of another example of an RF communications receiver according to aspects of the present invention.

Referring to FIG. 3, there is illustrated another example of a receiver 300 according to certain embodiments. The receiver 300 may operate similarly to the receiver 100 discussed above with reference to FIG. 1 (with like or similar components having like reference numerals); however, in this example, the demodulator 140 includes one or more RLC resonant circuits 400 instead of the microwave cavity resonator 110. The RLC circuit 400 receives the phase modulated input signal 130 and produces an analog output signal 410 having characteristics representative of the phase modulation of the input signal 130.

Figure 4:
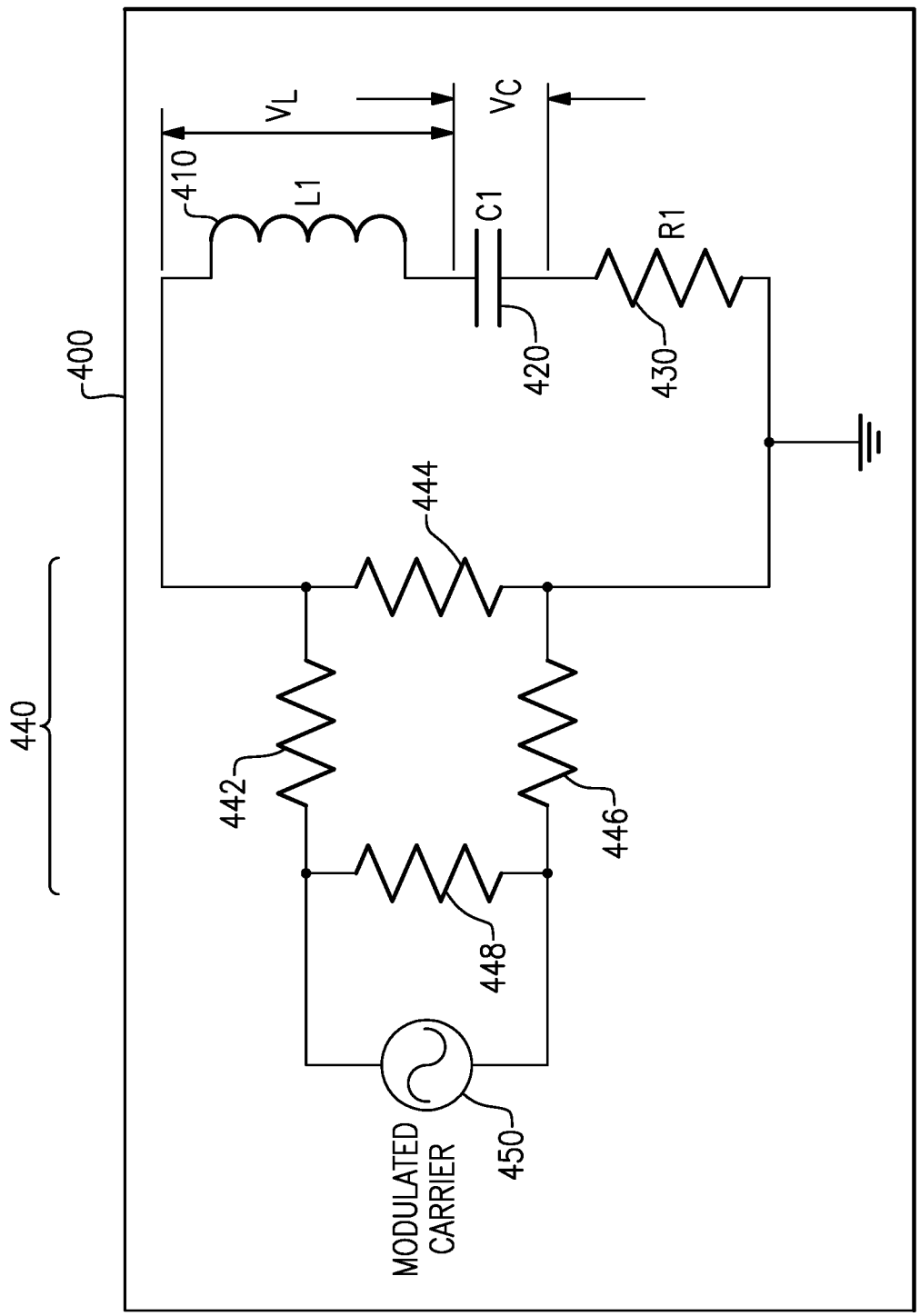
FIG. 4 is block diagram of one example of an RLC resonator circuit as may be included in the RF communications receiver of FIG. 3.

A representative RLC circuit 400 that can be used as an analog phase change detector is shown in FIG. 4. The RLC circuit 400 includes a series arm combination of an inductive component 410, a capacitive component 420, and a resistive component 430. The inductive component 410 may include one or more discrete inductors, the capacitive component 420 may include one or more discrete capacitors, and the resistive component 430 may include one or more discrete resistors. The series arm (410, 420, 430) is connected to a resistive network 440, which in the illustrated example includes four resistors 442, 444, 446, and 448. For the purposes of simulating operation of the RLC circuit 400, the circuit is connected to an oscillator 450 that represents the input signal 130. The RLC circuit 400 operates as follows. At resonance, the voltages $V_L$ (across the inductive component 410) and $V_C$ (across the capacitive component 420) are of equal magnitude and 180 degrees out of phase. While the RLC circuit 400 is in a steady state condition, the sum of $V_L$ and $V_C$ is nearly zero. Noise and imperfect components prevent the difference from being exactly zero. When a phase change occurs in the input signal 130 (i.e., the modulated carrier represented by the oscillator 450), the RLC circuit 400 is abruptly moved from steady state to a transient state, which causes a voltage spike across either the capacitive component 420 or the inductive component 410, depending on the direction of the phase change.

Figure 5:
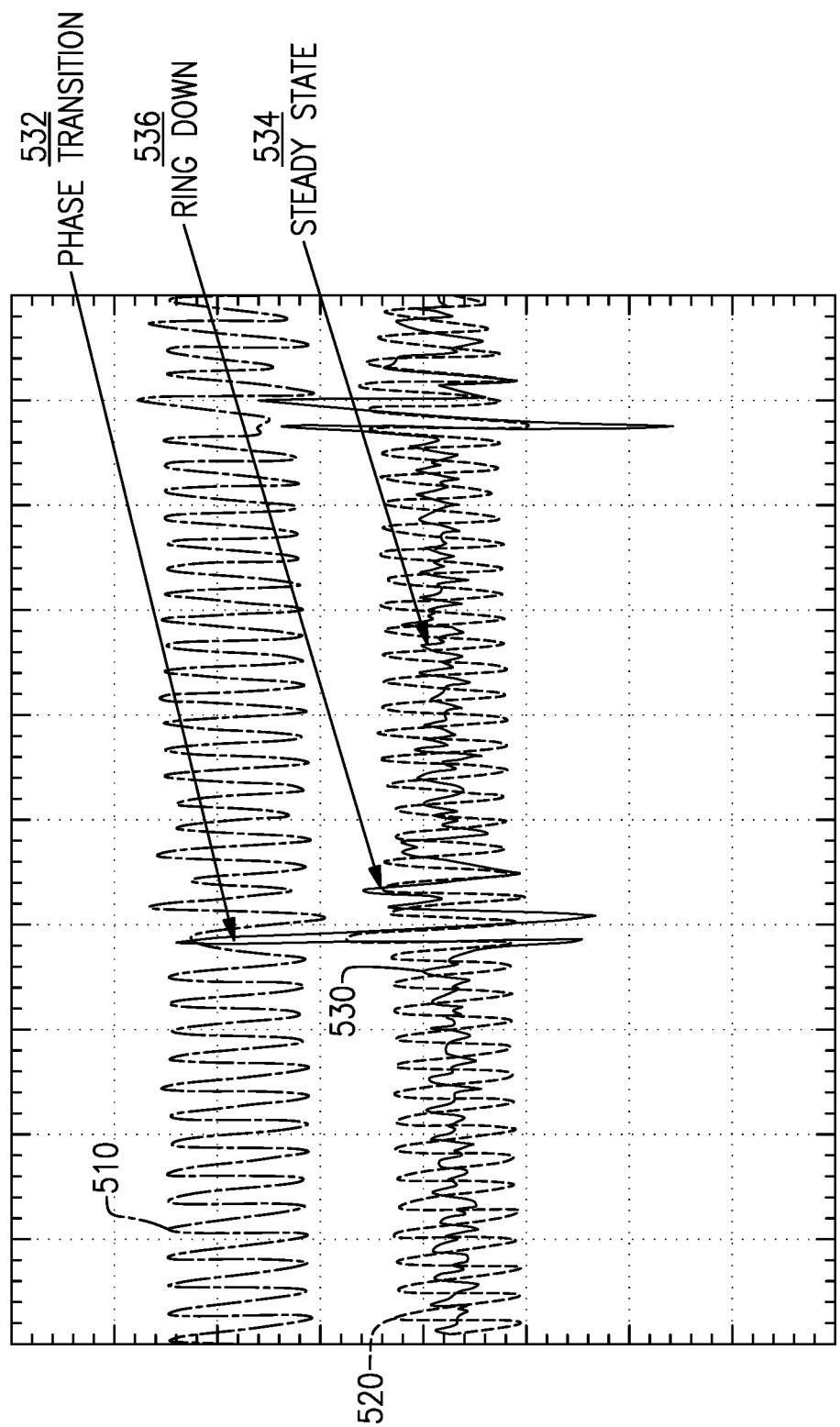
FIG. 5 is a graph illustrating simulated operation of an example of the RLC circuit of FIG. 4.

FIG. 5 is a graph showing a simulation of the transient and steady state circuit behaviors for the RLC circuit of FIG. 4. In FIG. 5, trace 510 is the voltage across the inductive component 410, trace 520 is the voltage across the capacitive component 420, and trace 530 is the sum of traces 510 and 520. As expected, trace 530 in nearly zero until a phase change in the input signal 130 occurs. Once the carrier changes phase, a large voltage spike 532 is generated and then the circuit returns to a steady state condition (534). A ring down 536 is seen following the initial voltage spike 532. Thus, by monitoring the combined voltage across the inductive component 410 and the capacitive component 420 (represented by trace 530 in FIG. 5) to detect the voltage spikes 532, phase changes in the input signal 130 can be detected.

Thus, aspects and embodiments provide microwave or RF (or similar frequency bands that may be used for communications) resonant circuits/structures that can be operated as phase change detectors and used in communications receivers to demodulate phase modulated input signals in the analog domain.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A communications receiver comprising:
   an input to receive a phase modulated radio frequency (RF) input signal;
   a resonator coupled to the input and configured to receive the phase modulated RF input signal and to produce an electrical output signal having characteristics representative of a phase modulation of the phase modulated RF input signal, the resonator including a resistor, inductor, and capacitor (RLC) circuit, the RLC circuit having a series arm including an inductive component connected in series with a capacitive and a resistive component; and
   signal processing circuitry configured to receive and process the electrical output signal to produce a decoded information signal.

2. The communications receiver of claim 1, wherein the electrical output signal has amplitude variations that correspond to the phase modulation of the phase modulated RF input signal.

3. The communications receiver of claim 2, wherein the electrical output signal is a voltage and the amplitude variations are voltage spikes.

4. The communications receiver of claim 1, wherein the input is an antenna.

5. A communications receiver comprising:
   an input to receive a phase modulated radio frequency (RF) input signal encoded with information;

at least one resonator coupled to the input and configured to receive the phase modulated RF input signal, to internally resonate signal energy in response to receiving the phase modulated RF input signal, and to produce an electrical output signal having a steady-state amplitude and amplitude variations, corresponding to deviations from the steady-state amplitude, that are representative phase transitions in the phase modulated RF input signal, the resonator including a resistor, inductor, and capacitor (RLC) circuit, the RLC circuit having a series arm including an inductive component connected in series with a capacitive and resistive component; and signal processing circuitry configured to receive and process the electrical output signal to produce a decoded information signal.

6. The communications receiver of any one of claim 5, wherein the electrical output signal is a voltage and the amplitude variations are voltage spikes.

7. The communications receiver of any one of claim 5, wherein the input is an antenna.

8. A communications receiver comprising:

an input to receive a phase modulated radio frequency (RF) input signal encoded with information;

a resistor, inductor, and capacitor (RLC) resonant circuit coupled to the input and configured to receive the phase modulated RF input signal, the RLC circuit including a series combination of an inductive component, a capacitive component, and a resistive component, wherein a voltage sum of a first voltage across the inductive component and a second voltage across the capacitive is representative of a phase modulation of the phase modulated RF input signal; and signal processing circuitry coupled to the RLC circuit and configured monitor the voltage sum to produce a decoded information signal.

9. The communications receiver of claim 8, wherein the voltage sum includes voltage spikes corresponding to phase transitions in the phase modulated RF input signal.

* * * * *